United States Patent
Mitsuhira et al.

(10) Patent No.: US 9,830,994 B1
(45) Date of Patent: Nov. 28, 2017

(54) SEQUENTIAL DESELECTION OF WORD LINES FOR SUPPRESSING FIRST READ ISSUE

(71) Applicant: SANDISK TECHNOLOGIES LLC, Plano, TX (US)

(72) Inventors: Noriyuki Mitsuhira, Ofuna (JP); Chun-Hung Lai, Kamakura (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/422,803

(22) Filed: Feb. 2, 2017

(51) Int. Cl.
| | |
|---|---|
| G11C 16/04 | (2006.01) |
| G11C 16/26 | (2006.01) |
| G11C 16/10 | (2006.01) |
| G11C 16/34 | (2006.01) |
| G11C 16/16 | (2006.01) |

(52) U.S. Cl.
CPC .......... *G11C 16/26* (2013.01); *G11C 16/0483* (2013.01); *G11C 16/10* (2013.01); *G11C 16/16* (2013.01); *G11C 16/3459* (2013.01)

(58) Field of Classification Search
USPC .......................... 365/185.25, 185.17, 185.18
See application file for complete search history.

(56) References Cited

U.S. PATENT DOCUMENTS

| | | | | |
|---|---|---|---|---|
| 7,408,811 B2* | 8/2008 | Shirota | .............. | G11C 16/0483 365/176 |
| 7,508,714 B2 | 3/2009 | Fasoli | | |
| 8,885,412 B2 | 11/2014 | Li | | |
| 9,412,463 B1 | 8/2016 | Chen | | |
| 2009/0316489 A1* | 12/2009 | Han | .................... | G11C 11/5642 365/185.25 |
| 2011/0128782 A1* | 6/2011 | Goda | ................. | G11C 16/0483 365/185.02 |

OTHER PUBLICATIONS

U.S. Appl. No. 15/198,205, filed Jun. 30, 2016.
U.S. Appl. No. 15/333,440, filed Oct. 25, 2016.
Dutta, et al., U.S. Appl. No. 15/451,186, filed Mar. 6, 2017, titled "First Read Countermeasures in Memory,".

* cited by examiner

*Primary Examiner* — Vu Le
(74) *Attorney, Agent, or Firm* — Vierra Magen Marcus LLP

(57) ABSTRACT

Systems and methods for reducing trapped electrons within a NAND string are described. During a sensing operation, one or more control circuits may discharge or initiate discharge of control gates corresponding with contiguous memory cell transistors of a NAND string from a read pass voltage (e.g., 10V) to a second voltage less than the pass voltage (e.g., 2V) in an order starting from a first set of the contiguous memory cell transistors closest to the first end of the NAND string and ending with a second set of the contiguous memory cell transistors closest to the second end of the NAND string. Subsequently, the one or more control circuits may either concurrently or simultaneously discharge the control gates corresponding with the contiguous memory cell transistors from the second voltage to a third voltage less than the intermediate voltage (e.g., from 2V to 0V).

20 Claims, 16 Drawing Sheets

First programming pass

Second programming pass

SEQUENTIAL DESELECTION OF WORD LINES FOR SUPPRESSING FIRST READ ISSUE

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM or PCM). A non-volatile memory may utilize floating-gate transistors or charge trap transistors. The ability to adjust the threshold voltage of a floating-gate transistor or charge trap transistor allows the transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors or multiple charge trap transistors in series with and between two select gates. The memory cell transistors in series and the select gates may be referred to as a NAND string. In recent years, NAND flash memory has been scaled in order to reduce cost per bit. However, as process geometries shrink, many design and process challenges are presented. These challenges include increased variability in transistor characteristics over process, voltage, and temperature variations.

DETAILED DESCRIPTION

Figure 1:
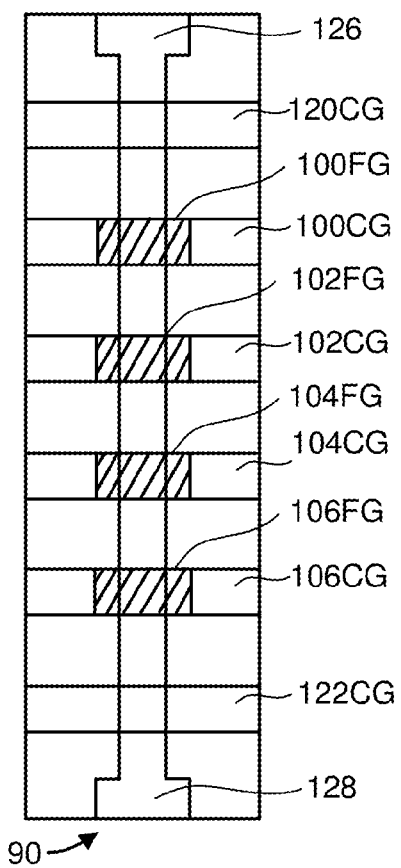
FIG. 1 depicts one embodiment of a NAND string.

Technology is described for eliminating or reducing trapped electrons within a NAND string subsequent to performing a sensing operation using the NAND string (e.g., a read operation or a program verify operation) or at the end of the sensing operation. In some cases, a first read issue may occur due to trapped electrons at the thin-oxide/polysilicon interface of memory cell transistors created at the end of a first read operation causing variation in the threshold voltages of the memory cell transistors during a second read operation subsequent to the first read operation. In one example, as word lines connected to unselected memory cell transistors of a NAND string are deselected following a sensing operation, the memory cell transistors that are in a high threshold voltage (VT) state (e.g., the C-state, the G-state or the highest programming state) may cause the channel of the NAND string to become cut-off during the discharge and result in the channel of the NAND string coupling down due to the discharging word lines. Subsequently, the voltage of the channel may be increased (e.g., due to holes moving into the channel) causing floating word lines to be coupled up (e.g., from 0V to 4V) and resulting in trapped electrons at the thin-oxide/polysilicon interface of memory cell transistors. The change in the threshold voltages of the memory cell transistors due to the trapped electrons may corrupt data stored in the memory cell transistors.

In some embodiments, during a sensing operation, one or more control circuits may discharge or initiate discharge of control gates corresponding with contiguous memory cell transistors of a NAND string from a read pass voltage (e.g., VREAD or 10V) to a second voltage less than the pass voltage (e.g., 0V or 3V) in an order starting from a first set of the contiguous memory cell transistors closest to the first end of the NAND string (e.g., a first memory cell transistor closest to the drain-side of the NAND string or closest to the bit line) and ending with a second set of the contiguous memory cell transistors closest to the second end of the NAND string (e.g., a second memory cell transistor closest to the source-side of the NAND string or closest to the source line). The contiguous memory cell transistors may comprise all the user accessible memory cell transistors within the NAND string. A dummy memory cell transistor within the NAND string that may be positioned between the contiguous memory cell transistors and a drain-side select gate may not comprise a user accessible memory cell transistor. A selected word line connected to a control gate of a selected memory cell of the contiguous memory cell transistors may be set to a sensing voltage (e.g., VCGR or a voltage less than VREAD) during the sensing operation.

In some embodiments, during a sensing operation (e.g., a read operation or a verify operation), one or more control circuits may discharge or initiate discharge of control gates corresponding with contiguous memory cell transistors of a NAND string from a read pass voltage (e.g., VREAD) to an intermediate voltage less than the pass voltage (e.g., 3V) in an order starting from a first set of the memory cell transistors closest to the first end of the NAND string (e.g., the bit-line side) and ending with a second set of the memory cell transistors closest to the second end of the NAND string (e.g., the source-line side). Subsequently, the one or more control circuits may either concurrently or simultaneously discharge the control gates corresponding with the contiguous memory cell transistors from the intermediate voltage to a third voltage less than the intermediate voltage (e.g., from 3V to 0V).

In some embodiments, during a two-step ramp down of the read pass voltage to the third voltage, the intermediate voltage between the read pass voltage and the third voltage may correspond with a voltage greater than a threshold voltage corresponding with a highest programmed data state for data stored within a NAND string. In this case, the NAND string will remain conducting as the intermediate voltage is greater than the threshold voltage for the highest programmed data state. In one example, if the highest programmed data state (e.g., the G-state) corresponds with a threshold voltage range between 5V and 5.5V, then the intermediate voltage may comprise a voltage greater than 5.5V (e.g., 6 V). In another example, the read pass voltage may comprise a voltage between 8V and 10V, the intermediate voltage may comprise a voltage between 5V and 6V, and the third voltage may comprise a voltage in the range of 2V and 0V.

A NAND string may include a tier select gate transistor arranged between and in series with a first set of memory cell transistors and a second set of memory cell transistors. In one embodiment, the number of transistors in the first set of memory cell transistors may be the same as or different from the number of transistors in the second set of memory cell transistors. For example, the first set of memory cell transistors may comprise 16 total transistors and the second set of memory cell transistors may comprise 32 total transistors, 16 total transistors, or 8 total transistors. One end of the first set of memory cell transistors may connect to a bit line while the other end of the first set of memory cell transistors may be connected to the tier select gate transistor. In this case, the tier select gate transistor may electrically isolate the first set of memory cell transistors from the second set of memory cell transistors when the tier select gate transistor is set into a non-conducting state. The tier select gate transistor within the NAND string may not comprise a user accessible memory cell transistor as the tier select gate transistor may not be able to store user data.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 2:
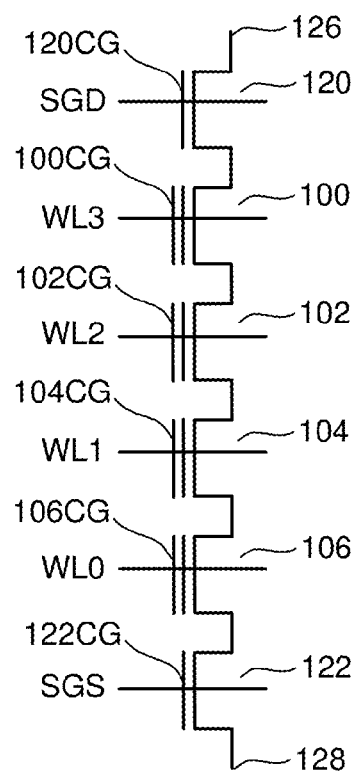
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory may be described herein, the technology disclosed herein may also be applied to other types of non-volatile storage devices and architectures. Moreover, although technology using floating-gate transistors is described herein, the technology described herein may also be applied to or used with other memory technologies including those that employ charge trapping, phase-change (e.g., chalcogenide materials), or state-change materials.

Figure 3A:
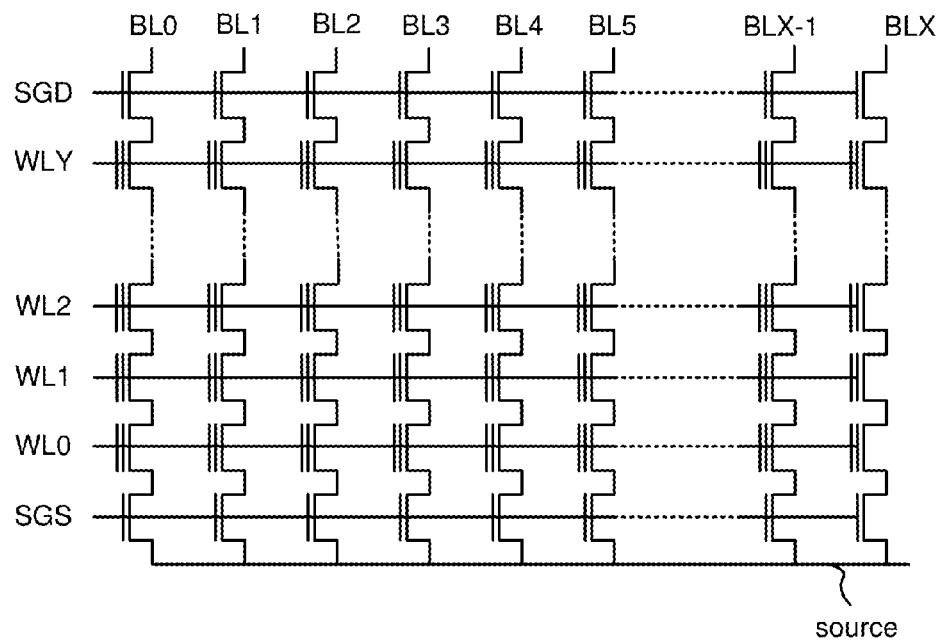
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. In some cases, during a verify operation, the source line may be set to 0V, to 1V, or to any voltage greater than or less than ground. In one example, during a verify operation, the source line may be set to 1V and the selected word line may be set to 5V. In another example, during a verify operation, the source line may be set to 3V and the selected word line may be set to 2V.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
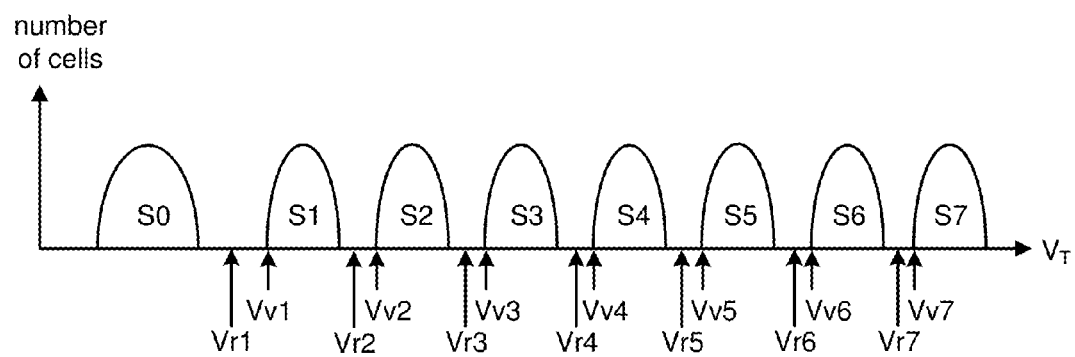
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7. The data state S1 may correspond with an A-state and the data state S7 may correspond with a G-state.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
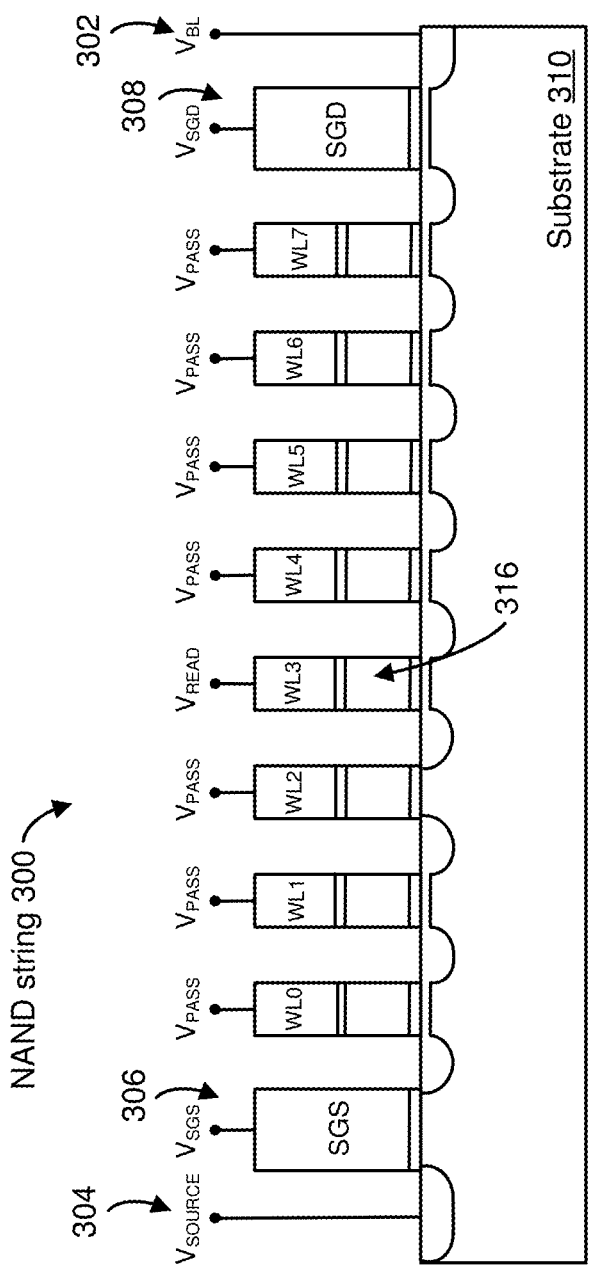
FIG. 3C depicts one embodiment of a NAND string during a read operation.

FIG. 3C depicts one embodiment of a NAND string 300 during a read operation. As depicted, the NAND string 300 includes a source-side select gate 306, a drain-side select gate 308, and eight word lines WL0-WL7 formed above a substrate 310. VSGS may be applied to the source-side select gate 306 and VSGD may be applied to the drain-side select gate 308. The bit line 302 may be biased to VBA and the source line 304 may be biased to VSOURCE. During a read operation, a sensing voltage, VREAD, may be applied to selected word line WL3, which is associated with a selected storage element 316 and a read pass voltage, VPASS, may be applied to the unselected word lines WL0-WL2 and WL4-WL7. The read pass voltage may be greater than the sensing voltage and be used to set the unselected word lines into conducting states so that the sensing voltage can be used to determine that data state of the selected storage element 316.

In some cases, a vertical NAND structure may comprise a vertical NAND string or a vertical inverted NAND string. A NAND string may comprise a string of floating gate transistors. An inverted NAND string may comprise a string of inverted floating gate transistors.

Figure 4A:
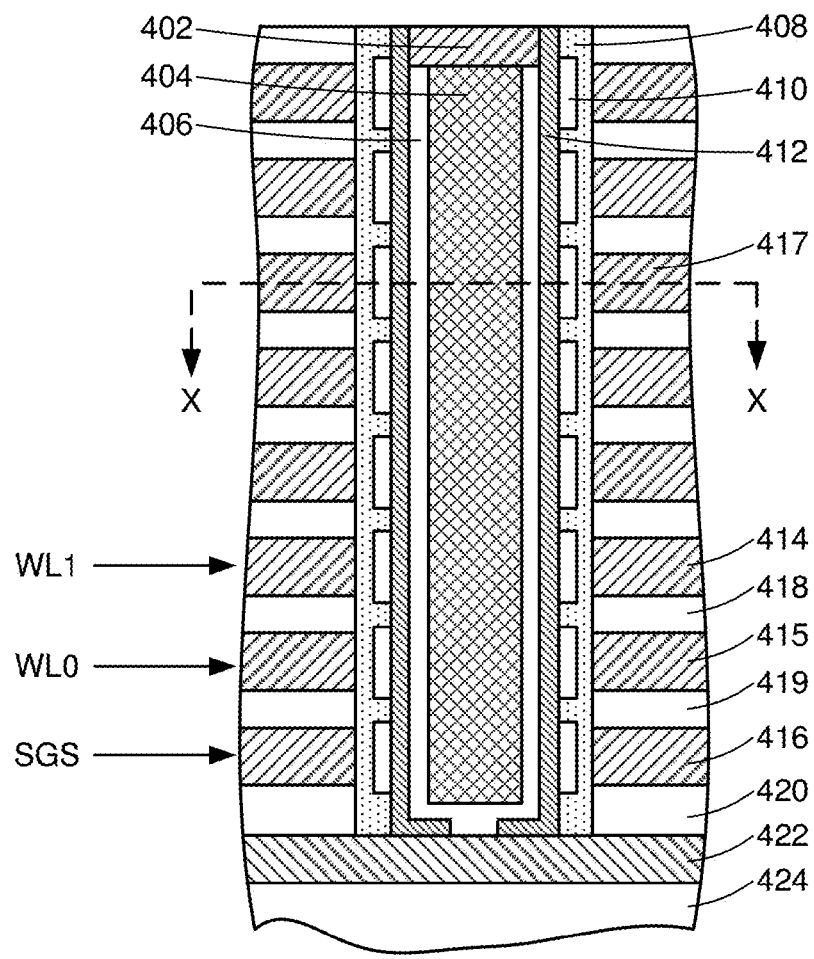
FIG. 4A depicts one embodiment of a vertical NAND structure.

FIG. 4A depicts one embodiment of a vertical NAND structure. The vertical NAND structure includes an inverted NAND string formed above the substrate 424 and oriented such that the inverted NAND string is orthogonal to the substrate 424. An inverted NAND string may comprise a NAND string that includes an inverted floating gate transistor with a tunneling oxide between a floating gate of the inverted floating gate transistor and a control gate of the inverted floating gate transistor. The arrangement of the tunneling oxide between the floating gate and the control gate allows the mechanism (e.g., F-N tunneling as the transport mechanism) for programming and/or erase of the inverted floating gate transistor to occur between the floating gate and the control gate rather than between the floating gate and the channel of the inverted floating gate transistor. The inverted NAND string may be arranged within a vertical memory hole that is etched through alternating layers of control gate material (e.g., tungsten, nitride, or polysilicon) and inter-gate insulator material (e.g., oxide or silicon dioxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a tunneling layer material 408 (e.g., including a thin oxide), a floating gate material 410 (e.g., polysilicon), a dielectric layer 412 (e.g., oxide), and a channel layer material 406 (e.g., undoped polysilicon) may be deposited within the memory hole and arranged in order to form the inverted NAND string. As depicted in FIG. 4A, the tunneling layer material 408 is arranged within or inside of the memory hole. The tunneling layer material 408 may comprise a portion of a multi-layer dielectric stack such as an ONO dielectric stack, which includes alternating layers of silicon dioxide ("O") and silicon nitride ("N"). In some cases, the tunneling layer material 408 may comprise a high-K dielectric material (e.g., hafnium-based high-K dielectrics or hafnium oxide) that has a dielectric constant that is greater than that of silicon dioxide. In some cases, a core material layer 404 (e.g., oxide) may be formed within the memory hole. In other cases, the core material layer 404 may be omitted. A bit line contact layer 402 may be formed at the top of the memory hole and connect to or directly abut the channel layer material 406. The channel layer material 406 may connect to the source line layer 422 at the bottom of the memory hole. Thus, in this case, the bit line contact layer 402 connects to the inverted NAND string at the top of the memory hole and the source line contact layer 422 connects to the inverted NAND string at the bottom of the memory hole.

In one embodiment, the bit line contact layer 402 may comprise a material of a first conductivity type (e.g., n-type) and the source line contact layer 422 may comprise a material of a second conductivity type different from the first conductivity type (e.g., p-type). In one example, the bit line contact layer 402 may comprise an n-type material (e.g., n-type polysilicon) and the source line contact layer 422 may comprise a p-type material (e.g., p-type polysilicon). In another example, the bit line contact layer 402 may comprise a p-type material and the source line contact layer 422 may comprise an n-type material (e.g., n-type polysilicon). Thus, in some cases, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may comprise n-channel operations and/or p-channel operations depending on the bias conditions applied to the inverted NAND string.

In one embodiment, an inverted NAND string may be formed using a core material layer (e.g., an oxide layer or other dielectric layer) that is arranged adjacent to a channel layer (e.g., an undoped polysilicon channel layer) that is arranged adjacent to a blocking layer (e.g., an oxide layer or other dielectric layer) that is arranged adjacent to a floating gate layer (or a charge trap layer) that is arranged adjacent to a tunneling layer (e.g., a thin oxide) that is arranged adjacent to a control gate layer (e.g., tungsten). The tunneling layer may have a thickness that is less than the thickness of the blocking layer.

Figure 4B:
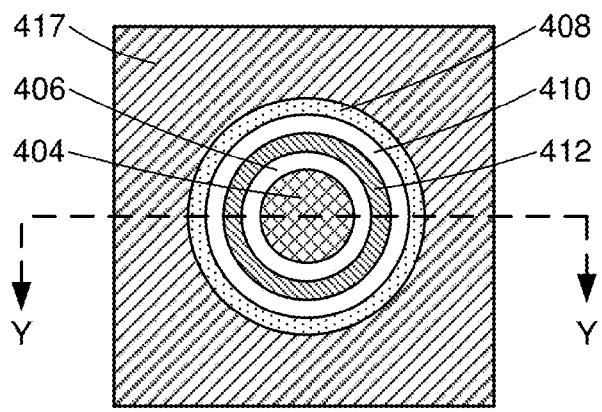
FIG. 4B depicts one embodiment of a cross-sectional view taken along line X-X of FIG. 4A.

FIG. 4B depicts one embodiment of a cross-sectional view taken along line X-X of FIG. 4A. As depicted, the inverted NAND string includes an inner core material layer 404 that is surrounded by the channel layer material 406 that is surrounded by the dielectric layer 412 that is surrounded by the floating gate material 410 that is surrounded by the tunneling layer material 408 that is surrounded by the control gate material layer 417. In one embodiment, FIG. 4A may depict a cross-sectional view taken along line Y-Y of FIG. 4B. In one embodiment, the inverted NAND string may be formed using a vertical cylindrical structure or a vertical tapered cylindrical structure. In this case, the dielectric material 412, floating gate material 410, tunneling layer material 408, and channel layer material 406 of the inverted NAND string may comprise vertical annular structures surrounding the core material layer 404. In another embodiment, the inverted NAND string may be formed using a vertical pillar structure or a vertical rectangular prism structure.

In some embodiments, a vertical NAND structure may include a vertical NAND string formed above a substrate and oriented such that the vertical NAND string is orthogonal to the substrate. The vertical NAND string may be arranged within a vertical memory hole that is etched through alternating layers of control gate material (e.g., tungsten or polysilicon) and inter-gate insulator material (e.g., oxide or silicon oxide).

Figure 5:
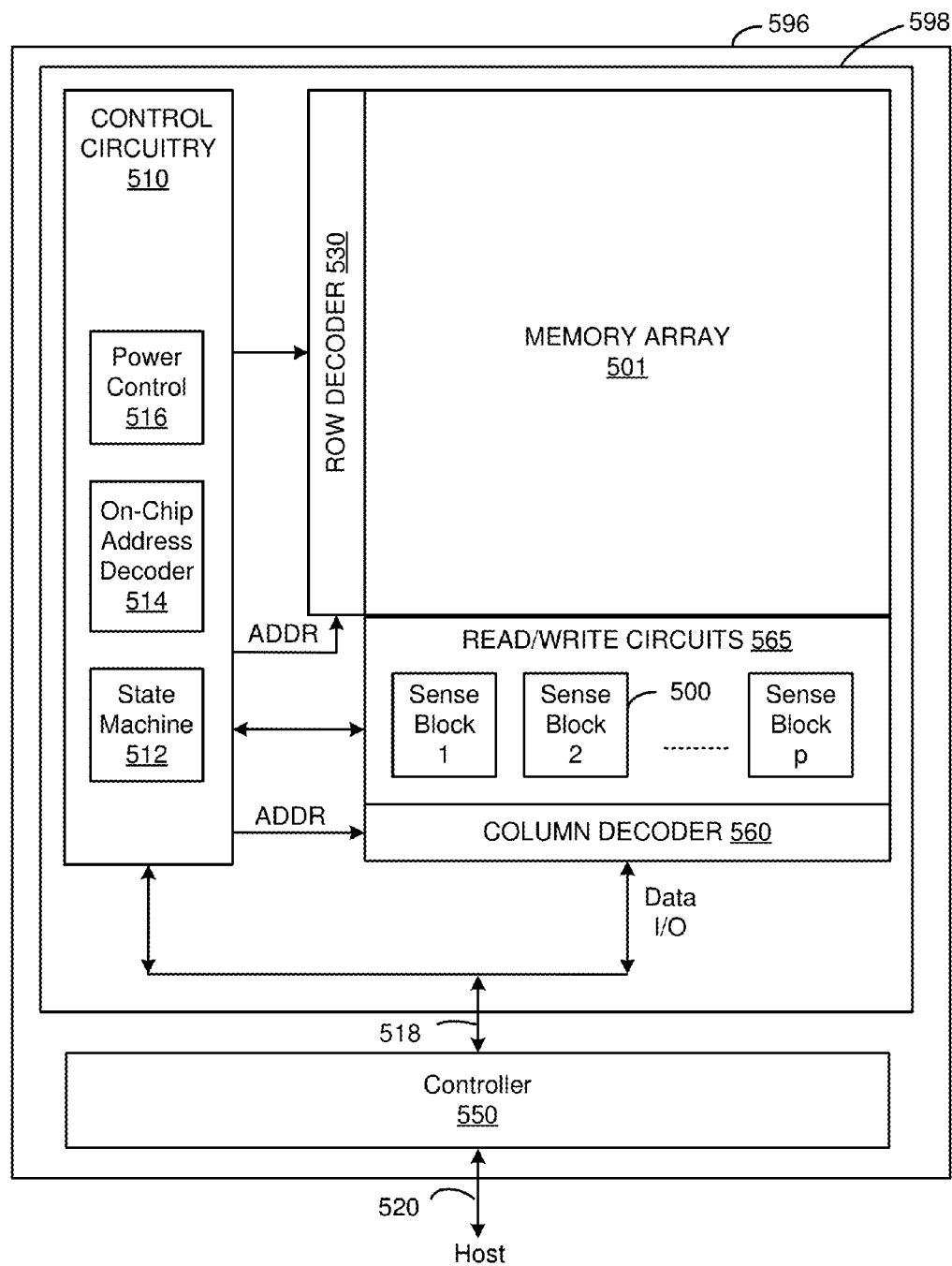
FIG. 5 depicts one embodiment of a non-volatile storage system.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between the addresses used by the host and the hardware addresses used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits or the one or more control circuits may perform or facilitate one or more memory array operations including erasing, programming, or reading operations.

In some embodiments, one or more managing or control circuits may be used for controlling the operation of a memory array, such as memory array 501. The one or more managing or control circuits may provide control signals to the memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more control circuits may enable or facilitate one or more memory array operations including erasing, programming, or reading operations to be performed on the memory array. In one example, the one or more control circuits may comprise an on-chip memory controller for determining row and column addresses, word line and bit line addresses, memory array enable signals, and/or data latching signals.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
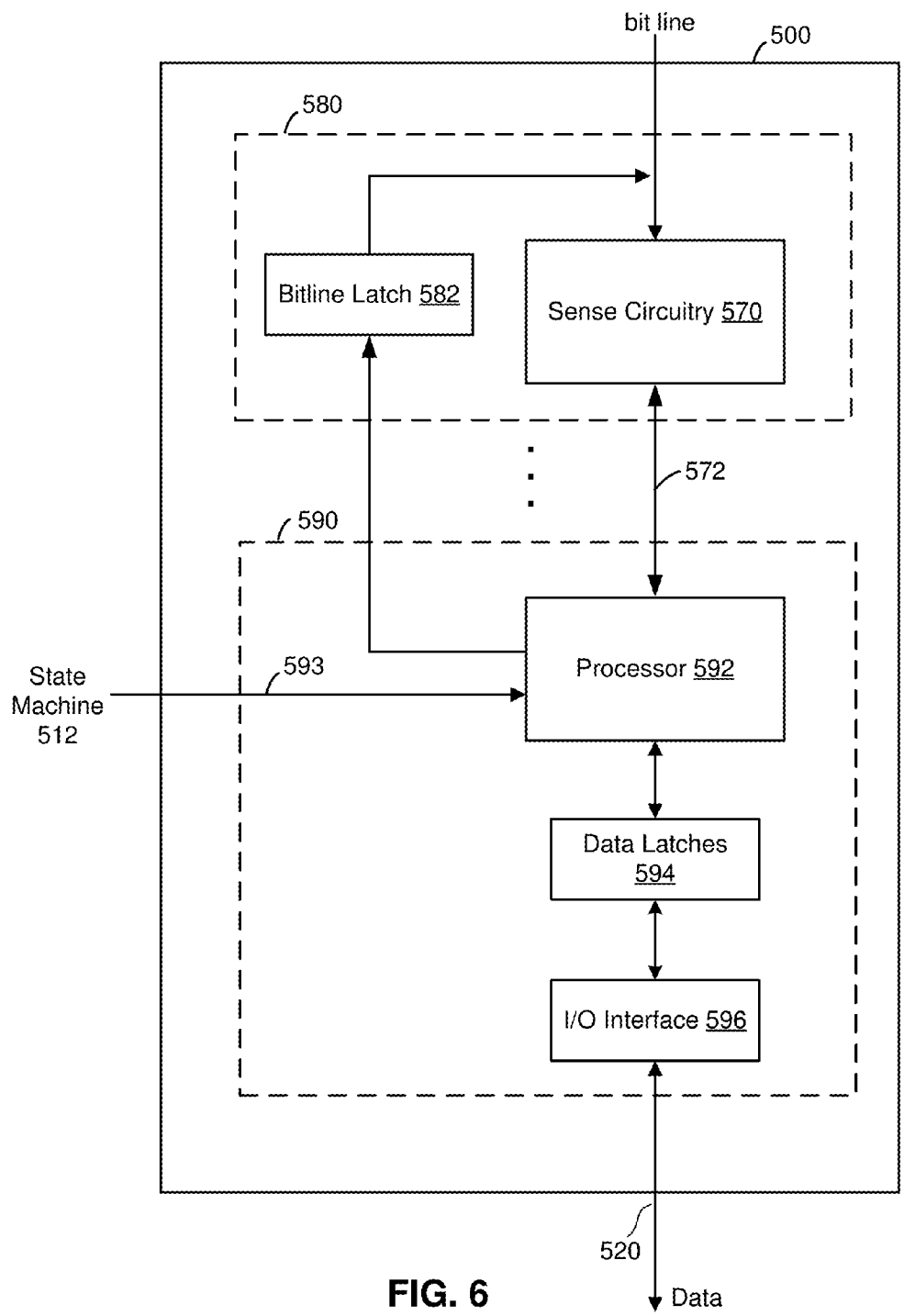
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
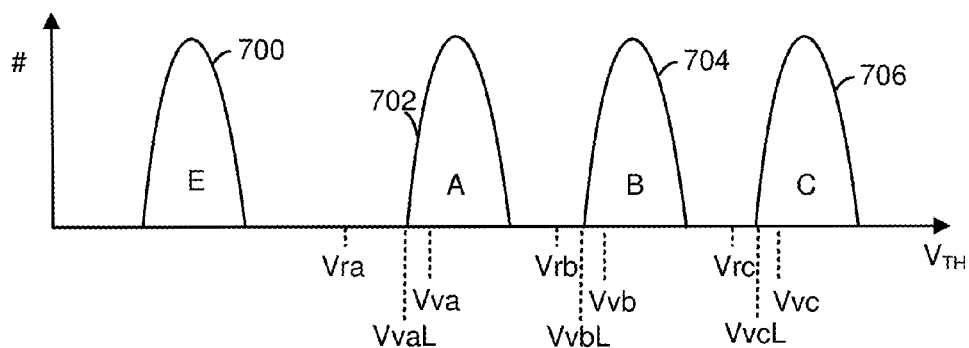
FIG. 7A depicts one embodiment of a set of threshold voltage distributions for a four-state memory device in which each storage element stores two bits of data.

FIG. 7A depicts one embodiment of a set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 7F, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
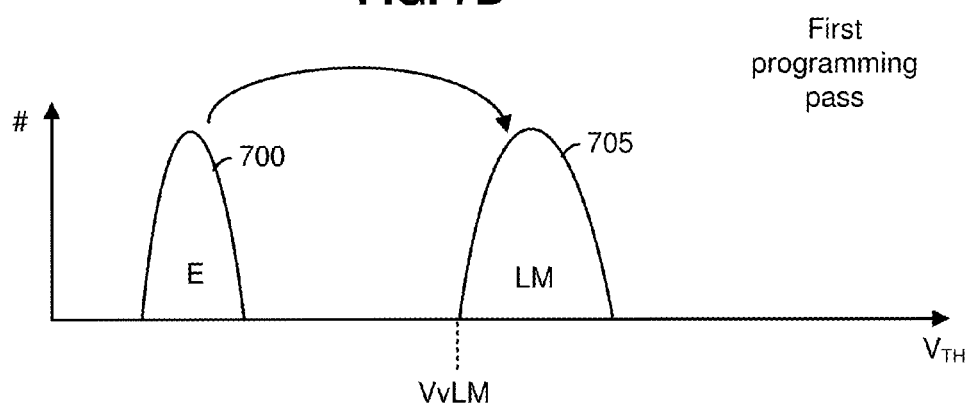
FIG. 7B depicts one embodiment of a first pass of a two-pass programming technique.

FIG. 7B depicts one embodiment of a first pass of a two-pass programming technique. In this example, a multi-state storage element stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower-middle) state (distribution 705).

In one embodiment, after a storage element is programmed from the E-state to the LM-state, its neighbor storage element on an adjacent word line WLn+1 in the NAND string will then be programmed with respect to its lower page in a respective first programming pass of the adjacent word line.

Figure 7C:
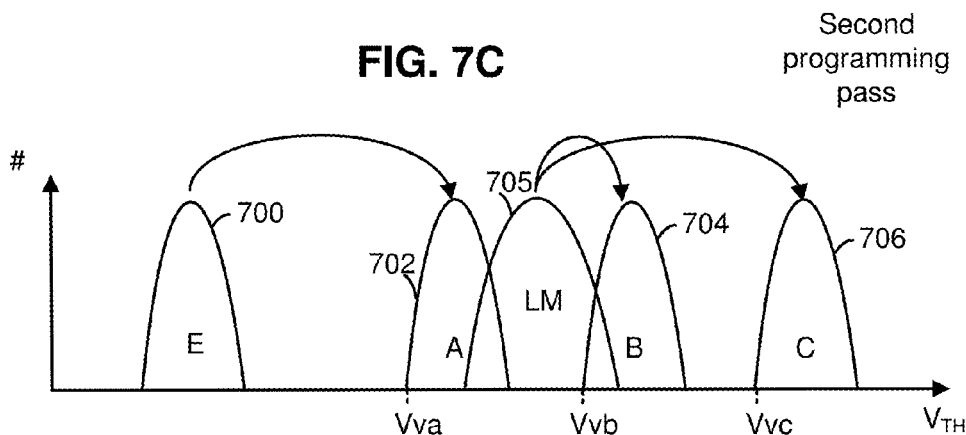
FIG. 7C depicts one embodiment of a second pass of the two-pass programming technique referred to in FIG. 7B.

FIG. 7C depicts one embodiment of a second pass of the two-pass programming technique referred to in FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706.

Figure 7D:
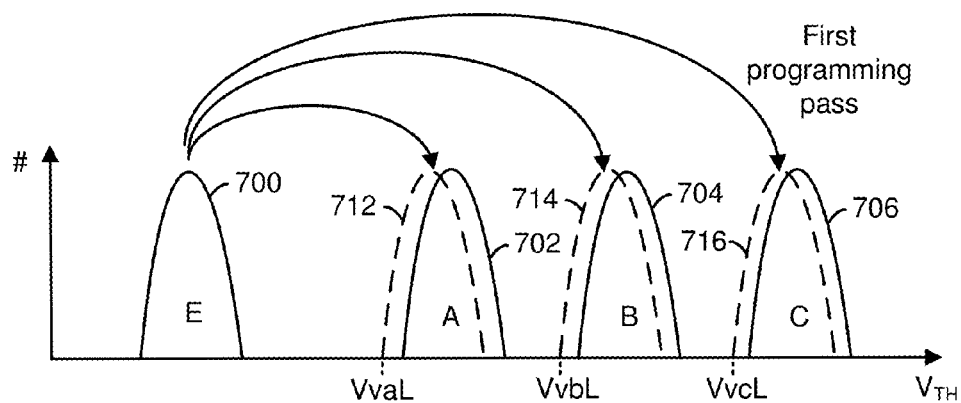
FIG. 7D depicts one embodiment of a first pass of another two-pass programming technique.

FIG. 7D depicts one embodiment of a first pass of another two-pass programming technique. In this example, referred to as foggy-fine (or course-fine) programming, the A-state, B-state and C-state storage elements are programmed from the E-state to distributions 712, 714 and 716, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 7E:
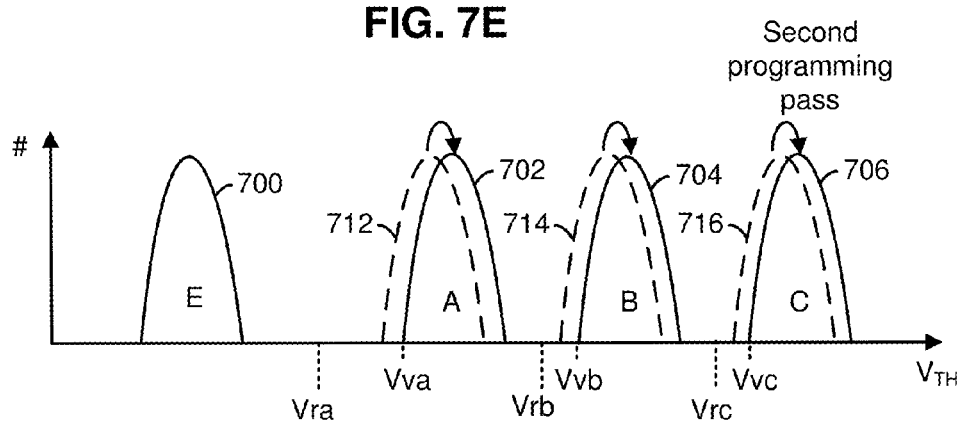
FIG. 7E depicts one embodiment of a second pass of the two-pass programming technique referred to in FIG. 7D.
Figure 7F:
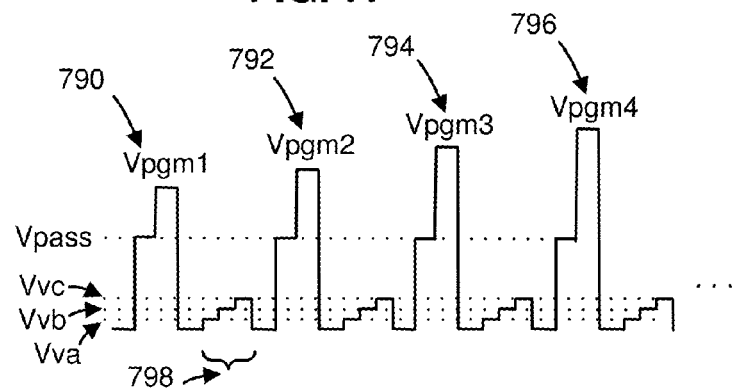
FIG. 7F depicts one embodiment of a series of program and verify pulses which are applied to a selected word line during a programming operation.

FIG. 7E depicts one embodiment of a second pass of the two-pass programming technique referred to in FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot. The programmed data states corresponding with the final distributions 702, 704 and 706 may be referred to as final programmed data states. The final programmed data state for a memory cell may correspond with the targeted threshold voltage or the targeted threshold voltage distribution for the memory cell. In some cases, the programmed data states corresponding with the final distributions 702, 704 and 706 may be referred to as target data states or intended programming data states.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state. Programming techniques which measure storage element current may be used as well. The concepts described herein may be adapted to the different programming techniques.

FIG. 7F depicts one embodiment of a series of program and verify pulses which are applied to a selected word line during a programming operation. A programming operation may include multiple program-verify iterations, in which each iteration applies one or more programming voltages followed by one or more verify voltages to the selected word line. In one embodiment, the programming voltages applied in a previous iteration may be stepped up in successive iterations. Moreover, the one or more programming voltages applied during a programming iteration may include a first portion which has a pass voltage (Vpass) level, e.g., 6-8 V, followed by a second, highest amplitude portion at a program level, e.g., 12-25 V. For example, a first, second, third and fourth programming pulses 790, 792, 794 and 796 have program levels of Vpgm1, Vpgm2, Vpgm3 and Vpgm4, respectively. One or more verify pulses 798 associated with verify voltages Vva, Vvb and Vvc may be provided after each programming pulse. In some cases, one or more initial programming pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

In one embodiment, a programming pulse may correspond with a voltage that is applied to a selected word line connected to a selected memory cell within a memory array during a programming operation that transitions from a first voltage (e.g., 0V) to an intermediate voltage (e.g., Vpass) then transitions from the intermediate voltage to a programming voltage (e.g., Vpgm1 or 15V). A program verify pulse may correspond with a voltage that is applied to a selected word line connected to a selected memory cell within a memory array during a program verify operation that transitions from a first voltage (e.g., 0V) to first verify voltage (e.g., Vva) and then transitions from the first verify voltage to a second verify voltage (e.g., Vvb).

Figure 8A:
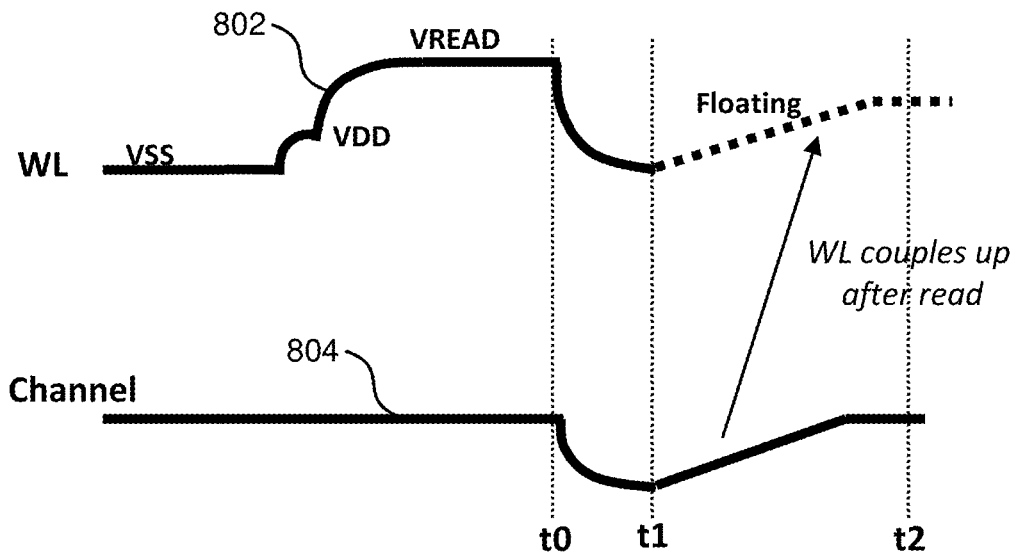
FIG. 8A depicts one embodiment of voltage waveforms applied to a portion of a NAND string during a read operation.

FIG. 8A depicts one embodiment of voltage waveforms applied to a portion of a NAND string during a read operation. As depicted, an unselected word line 802 is set to a read pass voltage VREAD during the read operation prior to time t0. At time t0, the unselected word line 802 is discharged from VREAD causing a portion of a channel 804 of the NAND string to couple down. At time t1, the channel 804 recovers and causes the unselected word line 802 to capacitively couple up after time t1. In one example, the unselected word line 802 may capacitively couple up from 0V at time t1 to 4V at time t2.

Figure 8B:
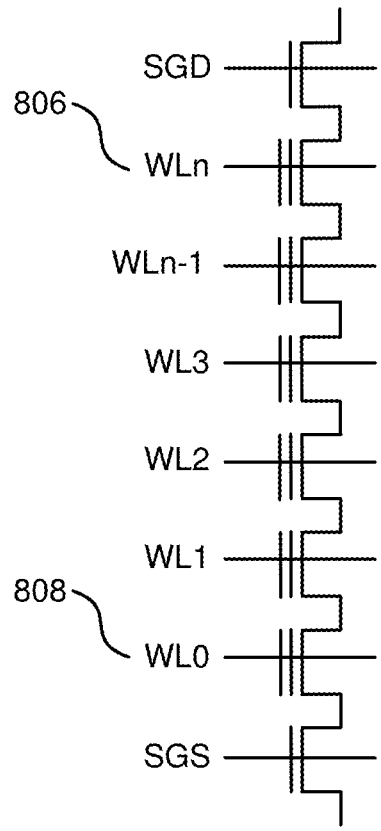
FIG. 8B depicts one embodiment of a NAND string with memory cell transistors corresponding with word lines WL0-WLn.

FIG. 8B depicts one embodiment of a NAND string with memory cell transistors corresponding with word lines WL0-WLn. The memory cell transistor 806 is closest to the drain-side select gate and the memory cell transistor 808 is closest to the source-side select gate. In one example, the NAND string may include 32 memory cell transistors corresponding with word lines WL0-WL31.

Figure 8C:
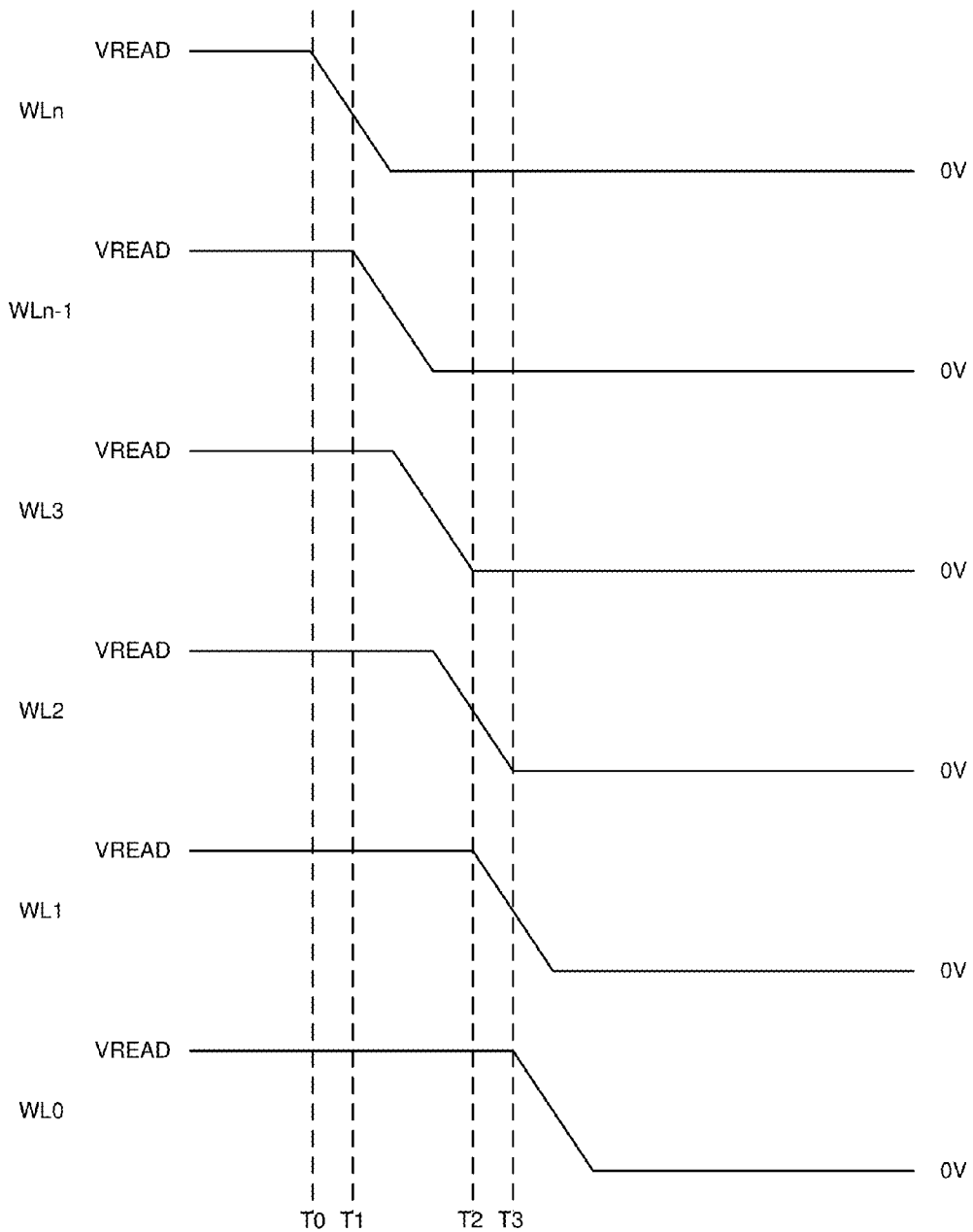
FIGS. 8C-8G depict various embodiment of voltage waveforms applied to the NAND string depicted in FIG. 8B.

FIG. 8C depicts one embodiment of voltage waveforms applied to the NAND string depicted in FIG. 8B. As depicted, at time T0, the voltage applied to word line WLn (the memory cell transistor closest to the drain-side select gate) begins to discharge from the read pass voltage VREAD towards 0V. At time T1 subsequent to time T0, the voltage applied to word line WLn−1 begins to discharge from the read pass voltage VREAD towards 0V. Subsequently, the sequence of discharging the word lines continues and at time T2 subsequent to time T1, the voltage applied to word line WL1 begins to discharge from the read pass voltage VREAD towards 0V and at time T3 subsequent to time T2, the voltage applied to word line WL0 begins to discharge from the read pass voltage VREAD towards 0V. In some cases, rather than discharging the control gates of each individual memory cell transistor starting from the memory cell transistor closest to the drain-side select gate and ending with the memory cell transistor closest to the source-side select gate, pairs of control gates may be discharged starting with the memory cell transistor pair closest to the drain-side select gate and ending with the memory cell transistor pair closest to the source-side select gate. Other memory cell transistor groupings may also be used. For example, a NAND string comprising 32 memory cell transistors may be divided into four groups of eight transistors and the memory cell transistor group closest to the drain-side select gate may be discharged or begin discharging prior to discharging the other memory cell transistor groups. The groups of control gates corresponding with each memory cell transistor group may be discharged starting with the memory cell transistor group closest to the drain-side select gate and ending with the memory cell transistor group closest to the source-side select gate. A selected word line connected to a control gate of a selected memory cell transistor of the NAND string may be deselected or discharged from a sensing voltage (e.g., VCGR) after time T3.

In some embodiments, rather than unidirectionally discharging the word lines from the drain-side end of the NAND string towards the source-side end of the NAND string, the sequential deselection of word lines may instead occur from the source-side end of the NAND string and move towards the drain-side end of the NAND string. In some cases, pairs of control gates may be discharged starting with the memory cell transistor pair closest to the source-side select gate and ending with the memory cell transistor pair closest to the drain-side select gate. Other memory cell transistor groupings may also be used. For example, a NAND string comprising 32 memory cell transistors may be divided into four groups of eight transistors and the memory cell transistor group closest to the source-side select gate may be discharged or begin discharging prior to discharging the other memory cell transistor groups. The groups of control gates corresponding with each memory cell transistor group may be discharged starting with the memory cell transistor group closest to the source-side select gate and ending with the memory cell transistor group closest to the drain-side select gate.

Figure 8D:
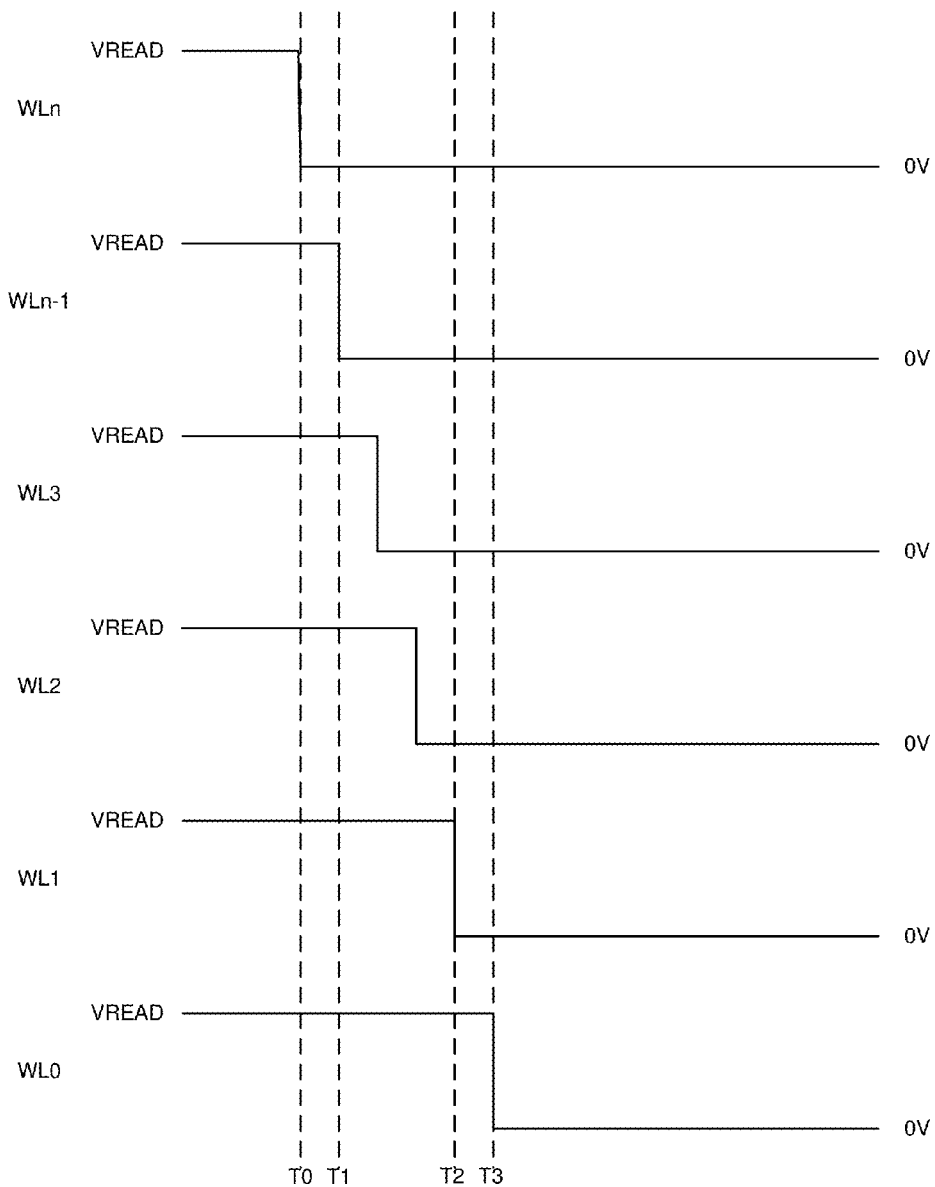

FIG. 8D depicts one embodiment of voltage waveforms applied to the NAND string depicted in FIG. 8B. As depicted, at time T0, the voltage applied to word line WLn (the memory cell transistor closest to the drain-side select gate) begins to discharge from the read pass voltage VREAD towards 0V and completes discharging prior to time T1. At time T1, the voltage applied to word line WLn−1 begins to discharge from the read pass voltage VREAD towards 0V and completes discharging prior to time T2. Subsequently, the sequence of discharging the word lines continues and at time T2 subsequent to time T1, the voltage applied to word line WL1 begins to discharge from the read pass voltage VREAD towards 0V and completes discharging prior to time T3. At time T3 subsequent to time T2, the voltage applied to word line WL0 begins to discharge from the read pass voltage VREAD towards 0V. In some cases, rather than discharging the control gates of each individual memory cell transistor starting from the memory cell transistor closest to the drain-side select gate and ending with the memory cell transistor closest to the source-side select gate, pairs of control gates may be complete discharged or be completely deselected starting with the memory cell transistor pair closest to the drain-side select gate and ending with the memory cell transistor pair closest to the source-side select gate. Other memory cell transistor groupings may also be used (e.g., grouping of 4 transistors, 8 transistors, or 16 transistors).

In some embodiments, the groupings of memory cell transistors may be of different sizes. For example, the first grouping of memory cell transistors may comprise 2 transistors, the second grouping of memory cell transistors may comprise 4 transistors, the third grouping of memory cell transistors may comprise 8 transistors, and the fourth grouping of memory cell transistors may comprise 18 transistors. In some cases, the sizes of the groupings may be monotonically increasing from the drain-side end of a NAND string to the source-side end of the NAND string.

Figure 8E:
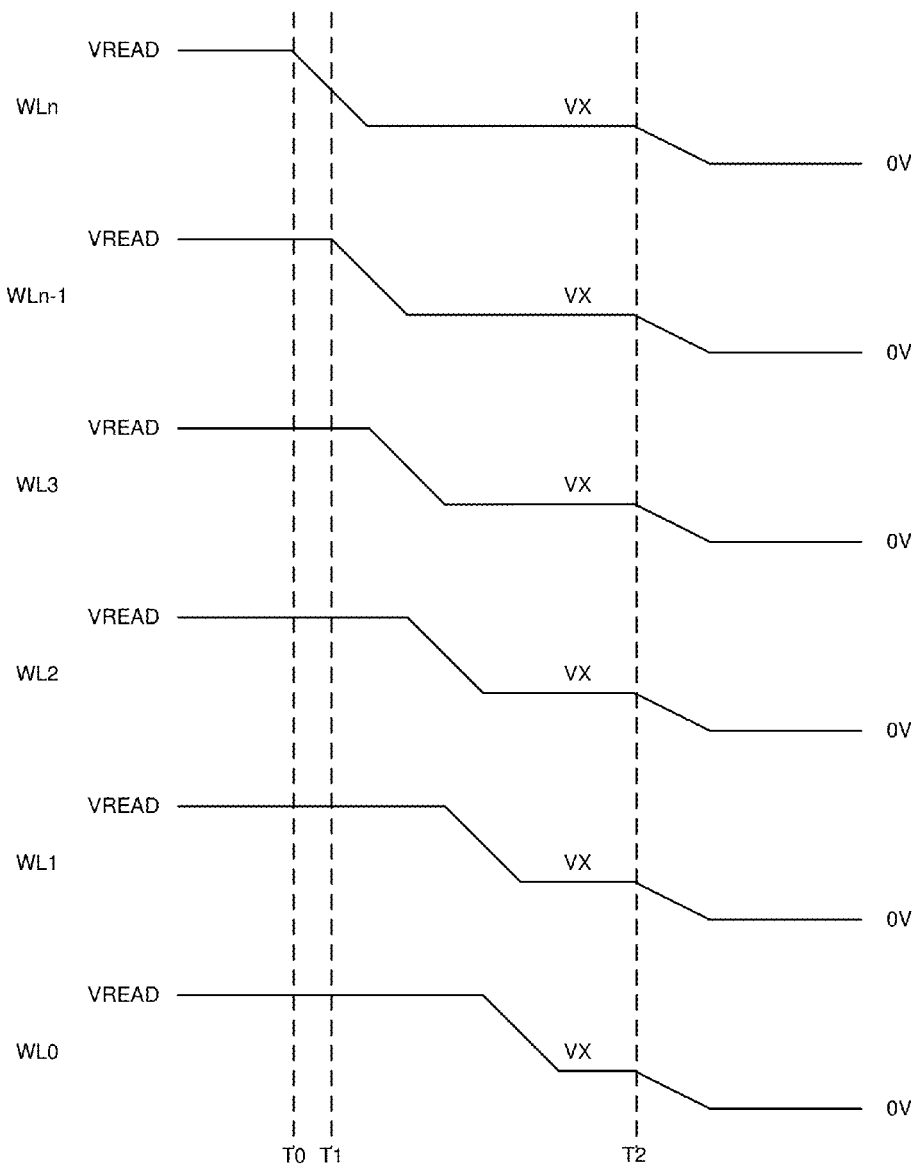

FIG. 8E depicts one embodiment of voltage waveforms applied to the NAND string depicted in FIG. 8B. As depicted, at time T0, the voltage applied to word line WLn (the memory cell transistor closest to the drain-side select gate) begins to discharge from the read pass voltage VREAD towards an intermediate voltage VX (e.g., 3V) that is between the read pass voltage and the final deselection voltage (e.g., 0V). At time T1 subsequent to time T0, the voltage applied to word line WLn−1 begins to discharge from the read pass voltage VREAD towards the intermediate voltage VX (e.g., 3V) that is between the read pass voltage and the final deselection voltage. Subsequently, the sequence of discharging the word lines continues and eventually the voltage applied to word line WL1 begins to discharge from the read pass voltage VREAD towards the intermediate voltage VX and then finally the voltage applied to word line WL0 begins to discharge from the read pass voltage VREAD towards the intermediate voltage. In some cases, rather than discharging the control gates of each individual memory cell transistor starting from the memory cell transistor closest to the drain-side select gate and ending with the memory cell transistor closest to the source-side select gate, pairs (or other groupings) of control gates may be discharged starting with the memory cell transistor pair (or grouping) closest to the drain-side select gate and ending with the memory cell transistor pair (or grouping) closest to the source-side select gate. Thereafter, at time T2, the voltages applied to the unselected word lines concurrently discharge from the intermediate voltage VX to the final deselection voltage.

Figure 8F:
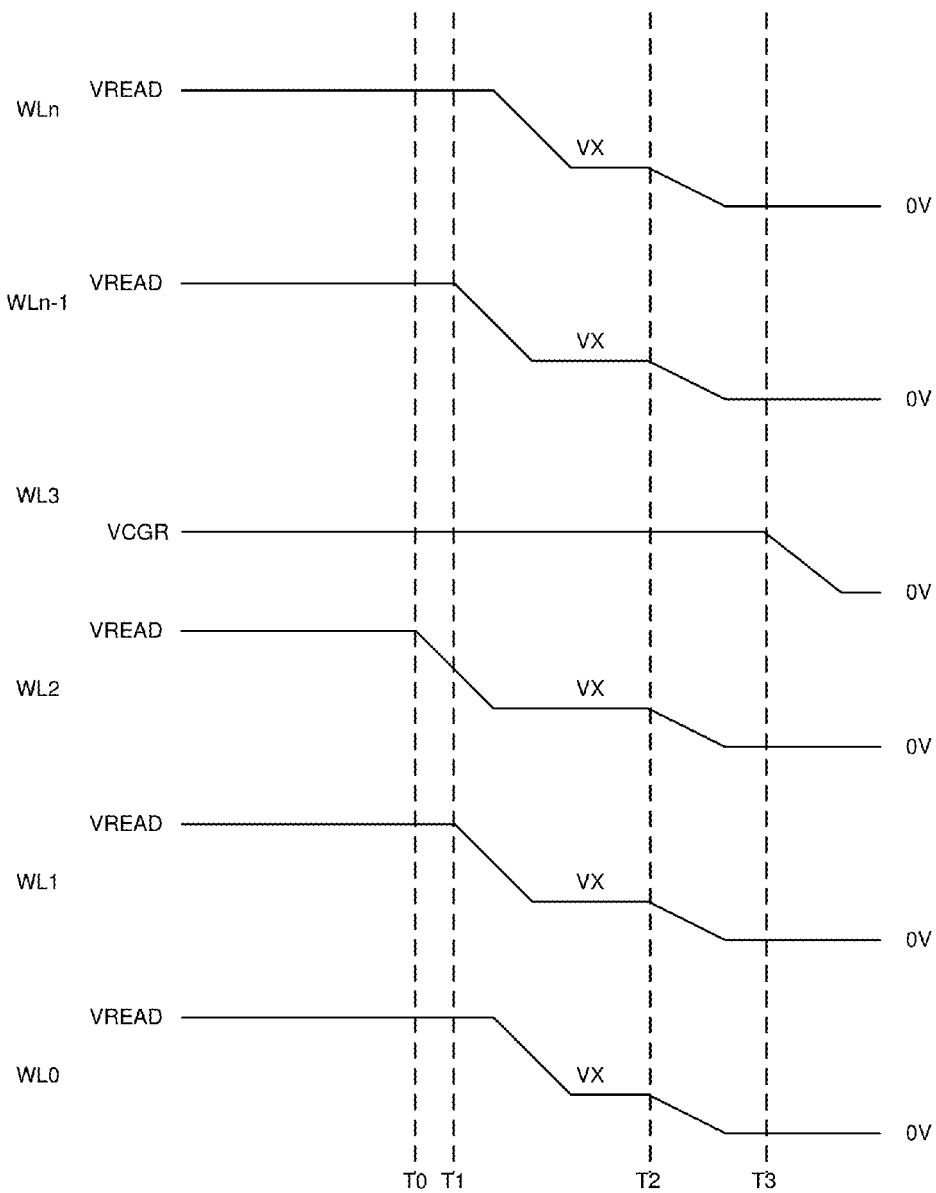

FIG. 8F depicts one embodiment of voltage waveforms applied to the NAND string depicted in FIG. 8B. As depicted, the unselected word lines of the NAND string begin discharging in a sequential order from a middle word line (or a middle grouping of word lines) of the NAND string towards the ends of the NAND string. A middle word line may comprise a word line that is positioned in the middle of the NAND string with an equal number of memory cell transistors on the drain-side of the middle word line towards the bit line as the number of memory cell transistors on the source-side of the middle word line towards the source line. For example, if a NAND string has only six word lines, then the two word lines WL3 and WL2 may comprise middle word lines that begin discharging prior to the discharging of the other unselected word lines. A selected word line connected to a control gate of a selected memory cell transistor of the NAND string may be deselected or discharged from a sensing voltage less than a read pass voltage (e.g., VCGR) after time the unselected word lines have been discharged.

As depicted, at time T0, the voltage applied to word line WL2 begins to discharge from the read pass voltage towards an intermediate voltage VX (e.g., 3V) that is between the read pass voltage and the final deselection voltage (e.g., 0V). The voltage applied to word line WL3 remains at the sensing voltage that was used to determine whether the selected memory cell transistor was in a particular data state. At time T1, the voltages applied to word lines WLn−1 and WL1 begin to discharge from the read pass voltage towards the intermediate voltage VX that is between the read pass voltage and the final deselection voltage. Thereafter, at time T2, the voltages applied to all the unselected word lines concurrently discharge from the intermediate voltage VX to the final deselection voltage. At time T3, the voltage applied to the selected word line WL3 discharges from the sensing voltage VCGR to the final deselection voltage.

Figure 8G:
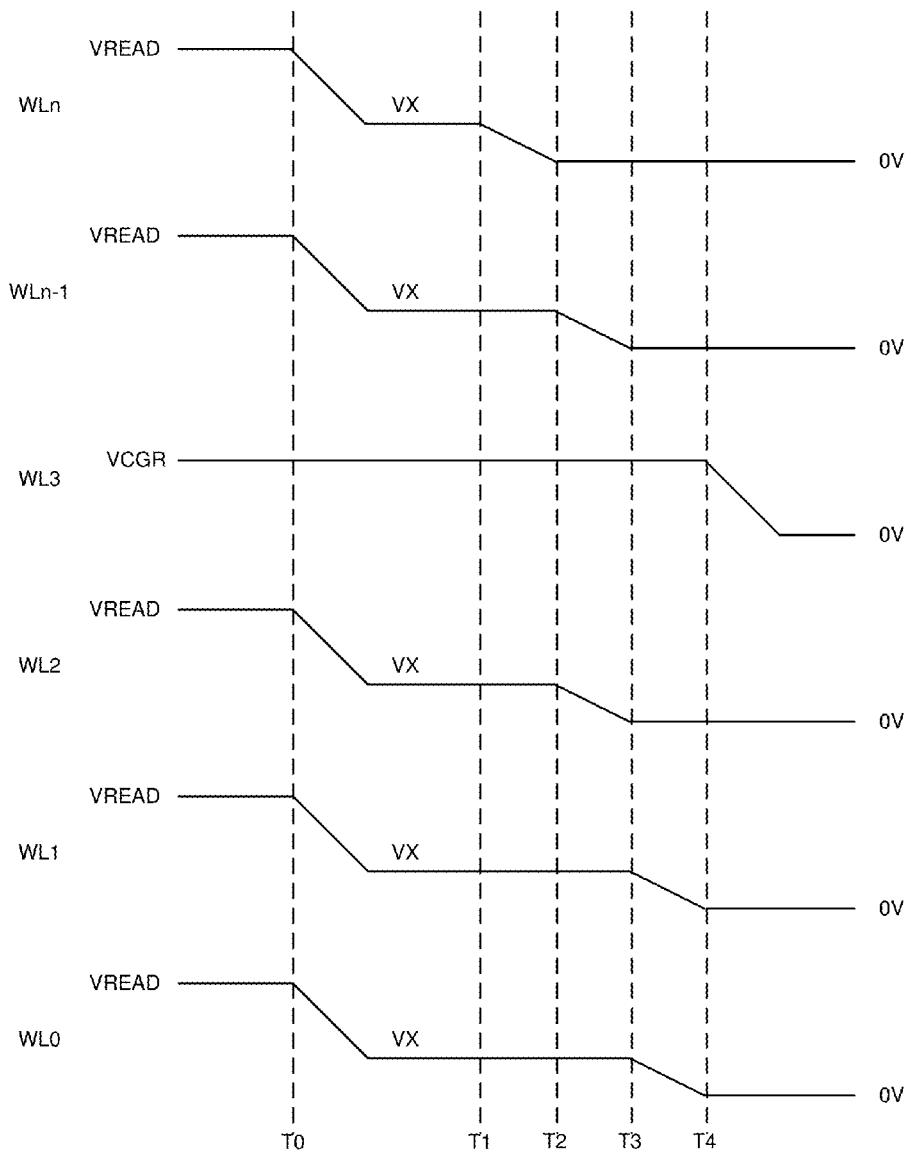

FIG. 8G depicts one embodiment of voltage waveforms applied to the NAND string depicted in FIG. 8B. As depicted, at time T0, the voltage applied to the unselected word lines including WLn and WL3-WL0 begin to discharge from the read pass voltage VREAD towards an intermediate voltage VX (e.g., 3V) that is between the read pass voltage and the final deselection voltage (e.g., 0V). Thereafter, at time T1, a first set of word lines including WLn discharge from the intermediate voltage VX to the final deselection voltage (e.g., 0V). At time T2 subsequent to time T1, a second set of word lines including WLn−1 and WL2 begin to discharge from the intermediate voltage VX to the final deselection voltage. At time T3 subsequent to time T2, a third set of word lines including WL1 and WL0 begin to discharge from the intermediate voltage VX to the final deselection voltage. At time T4 subsequent to time T3, the voltage applied to the selected word line WL3 discharges from the sensing voltage VCGR to the final deselection voltage. In some cases, the sizes of the groupings of word lines may be monotonically increasing from the drain-side end of a NAND string to the source-side end of the NAND string. In one example, the first set of word lines may comprise 1 word line, the second set of word lines may comprise 7 word lines, and the third set of word lines may comprise 24 word lines.

Figure 9A:
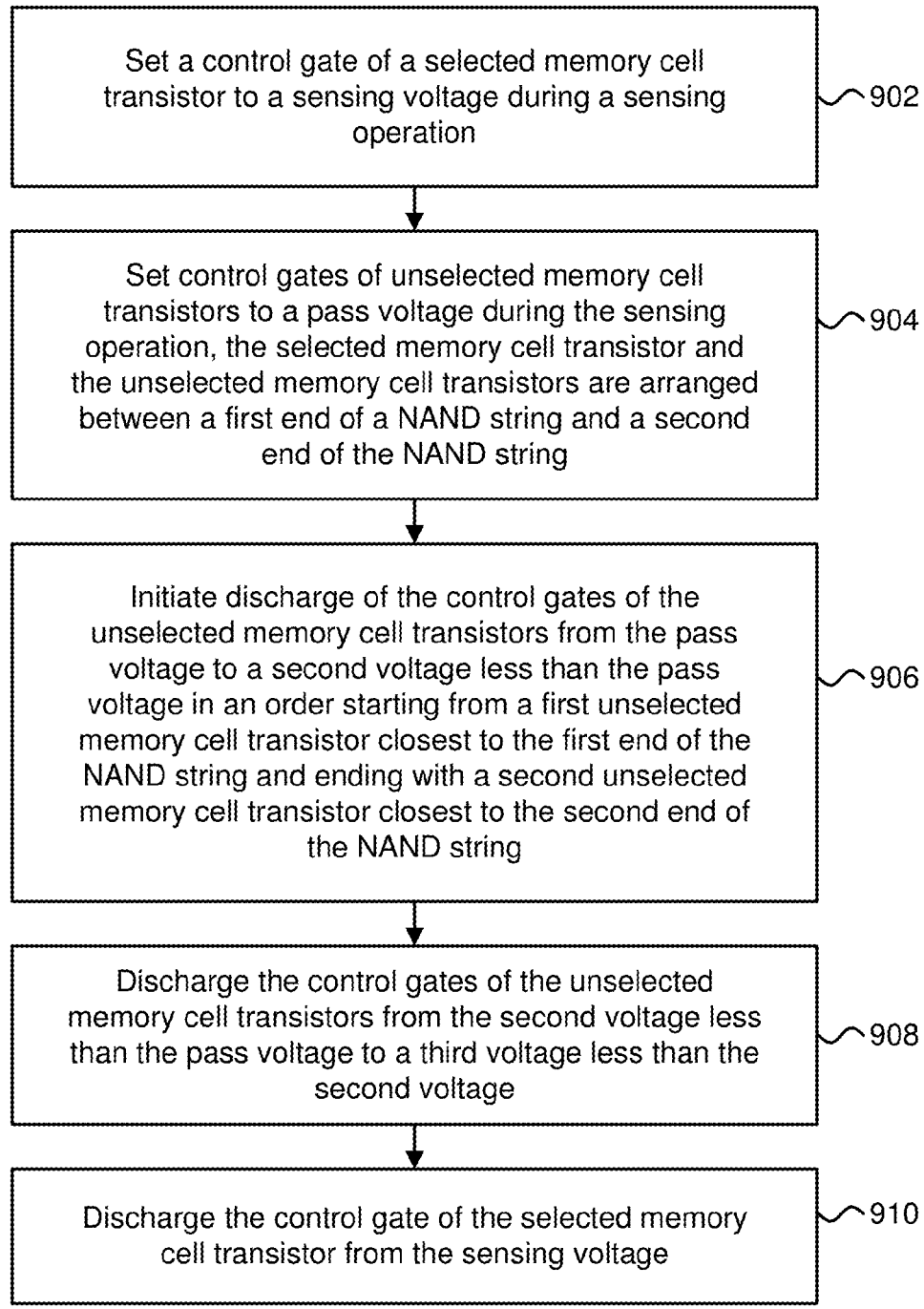
FIG. 9A is a flowchart describing one embodiment of a process for reading or verifying memory cells within a memory array.

FIG. 9A is a flowchart describing one embodiment of a process for reading or verifying memory cells within a memory array. In one embodiment, the process of FIG. 9A may be performed by a non-volatile storage system, such as non-volatile storage system 596 in FIG. 5A.

In step 902, a control gate of a selected memory cell transistor is set to a sensing voltage during a sensing operation. The sensing operation may comprise either a read operation, an erase verify operation, or a program verify operation. In step 904, control gates of unselected memory cell transistors are set to a pass voltage (e.g., a read pass voltage) during the sensing operation. The selected memory cell transistor and the unselected memory cell transistors are arranged between a first end of a NAND string and a second end of the NAND string. In one embodiment, the selected memory cell transistor and the unselected memory cell transistors may comprise all user addressable memory cell transistors and/or all user accessible memory cell transistors within the NAND string. In another embodiment, the selected memory cell transistor and the unselected memory cell transistors may comprise all transistors within the NAND string except for dummy transistors and select gate transistors.

In step 906, discharge of the control gates of the unselected memory cell transistors is initiated from the pass voltage to a second voltage less than the pass voltage in an order starting from a first unselected memory cell transistor closest to the first end of the NAND string and ending with a second unselected memory cell transistor closest to the second end of the NAND string. In one example, the first end of the NAND string may comprise the drain-side end of the NAND string that connects to a bit line. In another example, the first end of the NAND string may comprise the source-side end of the NAND string that connects to a source line. In step 908, the control gates of the unselected memory cell transistors are discharged from the second voltage (e.g., 3V) less than the pass voltage (e.g., 10V) to a third voltage (e.g., 0V) less than the second voltage. In step 910, the control gate of the selected memory cell transistor is discharged from the sensing voltage. In one embodiment, the control gate of the selected memory cell transistor is discharged from the sensing voltage after all the control gates of the unselected memory cell transistors have been discharged to the third voltage (e.g., the final deselection voltage).

Figure 9B:
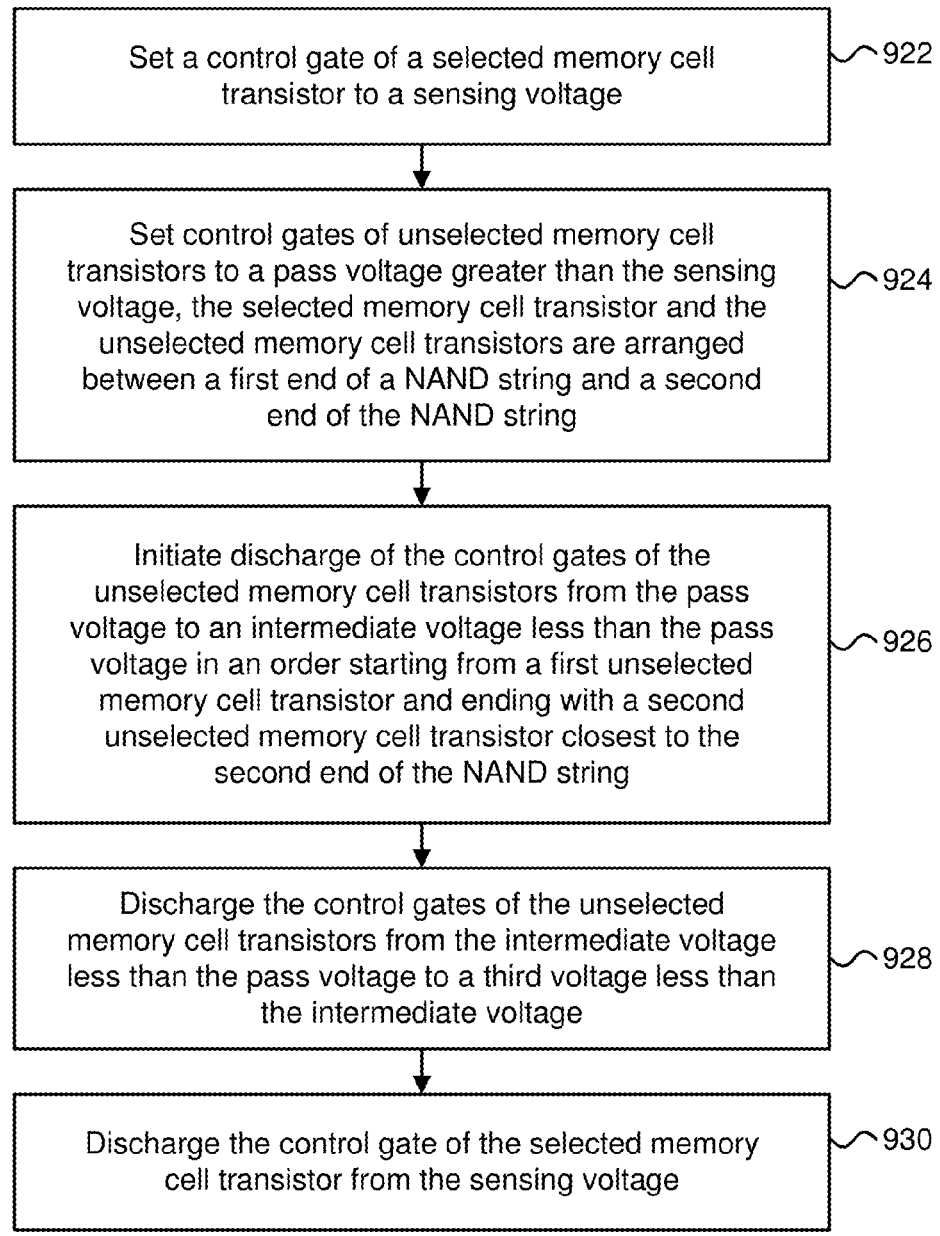
FIG. 9B is a flowchart describing another embodiment of a process for sensing memory cells within a memory array.

FIG. 9B is a flowchart describing another embodiment of a process for sensing memory cells within a memory array. In one embodiment, the process of FIG. 9B may be performed by a non-volatile storage system, such as non-volatile storage system 596 in FIG. 5A.

In step 922, a control gate of a selected memory cell transistor is set to a sensing voltage. The control gate of the selected memory cell transistor may be connected to a selected word line that is biased to the sensing voltage (e.g., to VCGR or a verify level). In step 924, control gates of unselected memory cell transistors are set to a pass voltage (e.g., 10V) greater than the sensing voltage (e.g., 6V). The selected memory cell transistor and the unselected memory cell transistors are arranged between a first end of a NAND string and a second end of the NAND string. In step 926, discharge of the control gates of the unselected memory cell transistors is initiated from the pass voltage to an intermediate voltage (e.g., 3V) less than the pass voltage (e.g., 10V) in order starting from a first unselected memory cell transistor and ending with a second unselected memory cell transistor closest to the second end of the NAND string. In one example, the first end of the NAND string may comprise the drain-side end of the NAND string that connects to a bit line. In another example, the first end of the NAND string may comprise the source-side end of the NAND string that connects to a source line.

In step 928, the control gates of the unselected memory cell transistors are discharged from the intermediate voltage less than the pass voltage to a third voltage (e.g., 0V) less than the intermediate voltage (e.g., 3V). In one example, the control gates of the unselected memory cell transistors are all concurrently discharged from the intermediate voltage less than the pass voltage to the third voltage less than the intermediate voltage. In step 930, the control gate of the selected memory cell transistor is discharged from the sensing voltage. In one example, the control gate of the selected memory cell transistor is discharged from the sensing voltage to the third voltage after all the control gates of the unselected memory cell transistors are discharged to the third voltage.

One embodiment of the disclosed technology includes a NAND string and a control circuit. The NAND string including a selected memory cell transistor and sets of contiguous memory cell transistors arranged between a first end of the NAND string and a second end of the NAND string. The selected memory cell transistor and the sets of contiguous memory cell transistors comprise all user accessible memory cell transistors within the NAND string. For example, dummy transistors may exist between the contiguous memory cell transistors and a drain-side select gate. The control circuit configured to initiate discharge of control gates corresponding with each set of the sets of contiguous memory cell transistors from a pass voltage to a second voltage less than the pass voltage in an order starting from a first set of the sets of contiguous memory cell transistors closest to the first end of the NAND string and ending with a second set of the sets of contiguous memory cell transistors closest to the second end of the NAND string.

One embodiment of the disclosed technology includes a NAND string and a control circuit. The NAND string including a selected memory cell transistor and a first set of unselected memory cell transistors arranged between a first end of the NAND string and a second end of the NAND string. The control circuit configured to set a control gate of the selected memory cell transistor to a sensing voltage while control gates corresponding with the first set of unselected memory cell transistors are set to a pass voltage greater than the sensing voltage. The control circuit configured to discharge the control gates corresponding with the first set of unselected memory cell transistors from the pass voltage to an intermediate voltage less than the pass voltage. The control circuit configured to initiate discharge of the control gates corresponding with the first set of unselected memory cell transistors from the intermediate voltage to a second voltage less than the intermediate voltage in an order starting from a first memory cell transistor of the first set of unselected memory cell transistors closest to the first end of the NAND string and ending with a second memory cell transistor of the first set of unselected memory cell transistors closest to the second end of the NAND string.

One embodiment of the disclosed technology includes a NAND string and a control circuit. The NAND string including sets of memory cell transistors arranged between a first end of the NAND string and a second end of the NAND string. The control circuit configured to discharge control gates corresponding with each set of the sets of memory cell transistors from a pass voltage to an intermediate voltage less than the pass voltage in an order starting from a first set of the sets of memory cell transistors closest to the first end of the NAND string and ending with a second set of the sets of memory cell transistors closest to the second end of the NAND string. The control circuit configured to concurrently discharge the control gates corresponding with the sets of memory cell transistors from the intermediate voltage to a second voltage less than the intermediate voltage.

One embodiment of the disclosed technology includes applying a voltage at a control gate read level to a selected word line in a set of word lines while sensing memory cells connected to the selected word line and while applying a voltage at a read pass level to unselected word lines in the set of word lines and ramping down voltages of different subsets of word lines in the set of word lines, one subset at a time, starting with a drain side subset of word lines of the set of word lines. In some cases, the ramping the down the voltages of the different subsets of word lines in the set of word lines proceeds from the drain side subset of word lines of the set of word lines to a source side subset of word lines of the set of word lines. In some cases, the ramping down the voltages of the different subsets of word lines causes the voltages of the different subsets of word lines to reach an intermediate level, between a starting level and a final level; and the method further comprises ramping down the voltages of the different subsets of word lines concurrently from the intermediate level to the final level.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
 a NAND string including a selected memory cell transistor and sets of contiguous memory cell transistors arranged between a first end of the NAND string and a second end of the NAND string, the selected memory cell transistor and the sets of contiguous memory cell transistors comprise user accessible memory cell transistors within the NAND string; and
 a control circuit configured to initiate discharge of control gates corresponding with each set of the sets of contiguous memory cell transistors from a pass voltage to a second voltage less than the pass voltage in an order starting from a first set of the sets of contiguous memory cell transistors closest to the first end of the NAND string and ending with a second set of the sets of contiguous memory cell transistors closest to the second end of the NAND string.

2. The apparatus of claim 1, wherein:
 the first end of the NAND string comprises a drain-side end of the NAND string and the second end of the NAND string comprises a source-side end of the NAND string; and
 the sets of contiguous memory cell transistors comprise all user accessible memory cell transistors within the NAND string.

3. The apparatus of claim 1, wherein:
 the control circuit configured to apply a read voltage less than the pass voltage to a control gate of the selected memory cell transistor arranged between the first set of contiguous memory cell transistors and the second set of contiguous memory cell transistors while the pass voltage is applied to the first set of contiguous memory cell transistors and the second set of contiguous memory cell transistors.

4. The apparatus of claim 1, wherein:
 the pass voltage applied to the first set of contiguous memory cell transistors sets each memory cell transistor of the first set of contiguous memory cell transistors into a conducting state.

5. The apparatus of claim 1, wherein:
 the control circuit configured to apply a sensing voltage to a control gate of the selected memory cell transistor while the pass voltage is applied to the first set of contiguous memory cell transistors and the second set of contiguous memory cell transistors.

6. The apparatus of claim 1, wherein:
 the control circuit configured to discharge control gates corresponding with the first set of contiguous memory cell transistors from the pass voltage to the second voltage during a first time period and discharge control gates corresponding with the second set of contiguous memory cell transistors from the pass voltage to the second voltage during a second time period subsequent to the first time period.

7. The apparatus of claim 1, wherein:
 the second voltage comprises one of 0V or 2V.

8. The apparatus of claim 1, wherein:
 the NAND string includes a drain-side select gate and the first set of contiguous memory cell transistors is positioned adjacent to the drain-side select gate.

9. The apparatus of claim 1, wherein:
 the NAND string comprises a vertical NAND string.

10. The apparatus of claim 1, wherein:
 the NAND string is part of a non-volatile memory that is monolithically formed in one or more physical levels of memory cells having active areas disposed above a silicon substrate.

11. An apparatus, comprising:
 a NAND string including a selected memory cell transistor and a first set of unselected memory cell transistors arranged between a first end of the NAND string and a second end of the NAND string; and
 a control circuit configured to set a control gate of the selected memory cell transistor to a sensing voltage while control gates corresponding with the first set of unselected memory cell transistors are set to a pass voltage greater than the sensing voltage, the control circuit configured to discharge the control gates corresponding with the first set of unselected memory cell transistors from the pass voltage to an intermediate voltage less than the pass voltage, the control circuit configured to initiate discharge of the control gates corresponding with the first set of unselected memory cell transistors from the intermediate voltage to a second voltage less than the intermediate voltage in an order starting from a first memory cell transistor of the first set of unselected memory cell transistors closest to the first end of the NAND string and ending with a second memory cell transistor of the first set of unselected memory cell transistors closest to the second end of the NAND string.

12. The apparatus of claim 11, wherein:
 the first end of the NAND string comprises a drain-side end of the NAND string and the second end of the NAND string comprises a source-side end of the NAND string; and
 the intermediate voltage comprises a voltage greater than a threshold voltage corresponding with a highest programmed data state.

13. The apparatus of claim 11, wherein:
 the NAND string includes a second set of unselected memory cell transistors arranged between the first end of the NAND string and the second end of the NAND string; and
 the control circuit configured to discharge control gates corresponding with the second set of unselected memory cell transistors from the pass voltage to the intermediate voltage and initiate discharge of the control gates corresponding with the second set of unselected memory cell transistors from the intermediate voltage to the second voltage in an order starting from a third memory cell transistor of the second set of unselected memory cell transistors closest to the second end of the NAND string and ending with a fourth memory cell transistor of the second set of unselected memory cell transistors closest to the first end of the NAND string.

14. The apparatus of claim 11, wherein:
the pass voltage applied to the control gates corresponding with the first set of unselected memory cell transistors sets each memory cell transistor of the first set of unselected memory cell transistors into a conducting state.

15. The apparatus of claim 11, wherein:
the control circuit configured to discharge the control gate corresponding with the first memory cell transistor of the first set of unselected memory cell transistors from the intermediate voltage to the second voltage during a first time period and discharge the control gate corresponding with the second memory cell transistor of the first set of unselected memory cell transistors from the intermediate voltage to the second voltage during a second time period subsequent to the first time period.

16. The apparatus of claim 11, wherein:
the second voltage comprises 0V;
the pass voltage comprises 8V; and
the intermediate voltage comprises 6V.

17. The apparatus of claim 11, wherein:
the NAND string includes a drain-side select gate and the first set of unselected memory cell transistors is positioned adjacent to the drain-side select gate.

18. A system, comprising:
a NAND string including sets of memory cell transistors arranged between a first end of the NAND string and a second end of the NAND string; and
a control circuit configured to discharge control gates corresponding with each set of the sets of memory cell transistors from a pass voltage to an intermediate voltage less than the pass voltage in an order starting from a first set of the sets of memory cell transistors closest to the first end of the NAND string and ending with a second set of the sets of memory cell transistors closest to the second end of the NAND string, the control circuit configured to concurrently discharge the control gates corresponding with the sets of memory cell transistors from the intermediate voltage to a second voltage less than the intermediate voltage.

19. The system of claim 18, wherein:
the first end of the NAND string comprises a drain-side end of the NAND string and the second end of the NAND string comprises a source-side end of the NAND string; and
the intermediate voltage comprises a voltage greater than a threshold voltage corresponding with a highest programmed data state of the sets of memory cell transistors.

20. The system of claim 18, wherein:
the NAND string includes a selected memory cell transistor; and
the control circuit configured to apply a read voltage less than the pass voltage to a control gate of the selected memory cell transistor while the pass voltage is applied to the first set of memory cell transistors and the second set of memory cell transistors, the pass voltage applied to the first set of memory cell transistors sets each memory cell transistor of the first set of memory cell transistors into a conducting state.

* * * * *